(12) United States Patent
He et al.

(10) Patent No.: US 11,360,128 B2
(45) Date of Patent: Jun. 14, 2022

(54) FAILURE DIAGNOSIS METHOD AND APPARATUS FOR POWER TUBE OF THREE-PHASE RECTIFIER BASED ON CURRENT SIGNAL

(71) Applicant: WUHAN UNIVERSITY, Hubei (CN)

(72) Inventors: Yigang He, Hubei (CN); Chunsong Sui, Hubei (CN); Hui Zhang, Hubei (CN); Bolun Du, Hubei (CN); Zhaorong Zeng, Hubei (CN); Mingyun Chen, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 17/161,677

(22) Filed: Jan. 29, 2021

(65) Prior Publication Data

US 2021/0389352 A1 Dec. 16, 2021

(30) Foreign Application Priority Data

Jun. 12, 2020 (CN) .......................... 202010534588.4

(51) Int. Cl.
*G01R 19/175* (2006.01)
*G01R 31/54* (2020.01)
*G01R 31/26* (2020.01)
*G01R 31/40* (2020.01)
*H02M 1/32* (2007.01)

(52) U.S. Cl.
CPC ....... *G01R 19/175* (2013.01); *G01R 31/2601* (2013.01); *G01R 31/40* (2013.01); *G01R 31/54* (2020.01); *H02M 1/32* (2013.01)

(58) Field of Classification Search
CPC .. G01R 19/175; G01R 31/2601; G01R 31/40; G01R 31/54; G01R 29/16; H02M 1/32; H02M 7/219
USPC .................................. 324/764.01, 537, 500
See application file for complete search history.

(56) References Cited

U.S. PATENT DOCUMENTS

| | | | |
|---|---|---|---|
| 2016/0233830 A1* | 8/2016 | Kouno | H02S 50/10 |
| 2018/0238935 A1* | 8/2018 | Nakashima | G01R 19/003 |
| 2019/0023310 A1* | 1/2019 | Odate | B62D 1/04 |
| 2020/0259321 A1* | 8/2020 | Morishita | H02H 1/0007 |
| 2021/0165044 A1* | 6/2021 | Imura | G01R 31/3275 |
| 2022/0049669 A1* | 2/2022 | Arafune | H03K 17/687 |

* cited by examiner

*Primary Examiner* — Giovanni Astacio-Oquendo
(74) *Attorney, Agent, or Firm* — JCIPRNET

(57) ABSTRACT

Provided are a failure diagnosis method and apparatus for open circuit failure of a power tube of a three-phase rectifier based on a current signal, relating to a failure diagnosis technique for power electronic equipment and capable of quickly and accurately diagnosing on an open circuit failure of the power tube of the three-phase rectifier without adding a hardware component. The failure diagnosis method only requires a sampled current existing in the control system of the rectifier and some intermediate computing signals and is therefore simple and requires little computing resource. A distorted current after the open circuit failure occurs in the power tube of the rectifier and a positive/negative half cycle where the current is present when the failure occurs serve as diagnostic variables. By analyzing the sampled current, a quick diagnosis on the power tube having the open circuit failure is provided. Thus, the invention is highly applicable.

11 Claims, 3 Drawing Sheets

FAILURE DIAGNOSIS METHOD AND APPARATUS FOR POWER TUBE OF THREE-PHASE RECTIFIER BASED ON CURRENT SIGNAL

CROSS-REFERENCE TO RELATED APPLICATION

This application claims the priority benefit of China application no. 202010534588.4, filed on Jun. 12, 2020. The entirety of the above-mentioned patent application is hereby incorporated by reference herein and made a part of this specification.

BACKGROUND OF THE INVENTION

Field of the Invention

The invention relates to a failure diagnosis technique for power electronic equipment, and more particularly relates to a failure diagnosis method and apparatus for an open circuit failure of a power tube of a three-phase rectifier based on a current signal.

Description of Related Art

Three-phase two-level voltage type pulse width modulation rectifiers have been extensively studied for and widely used in scenarios such as novel energy grids, energy storage, etc. Rectifiers serve as a core component in these scenarios, and the safety and stability in the operation of rectifiers certainly matter. A three-phase two-level rectifier generally includes six power tubes, each phase including two power tubes. A power tube near the positive electrode on the DC side is referred to as an upper bridge arm power tube, and a power tube near the negative electrode on the DC side is referred to as a lower bridge arm power tube. A power tube is key to power conversion. Nevertheless, according to a survey within the industry, power tubes are also one of the components which most easily fail. An open circuit failure of a power tube in a rectifier may lead to a distorted input current as well as a fluctuated DC output voltage. If such issue is left unaddressed for a certain time, the equipment may even be shut down. Therefore, a quick and accurate failure analysis for a power tube having an open circuit failure is crucial in facilitating the reliability of a rectifier.

Currently, there are not many techniques known for diagnosing the open circuit failure of the power tube of the rectifier. Instead, the conventional techniques mostly focus on the failure diagnosis of an inverter. However, the distortion of a three-phase current after the power tube of a rectifier exhibits an open circuit failure is quite different from the distortion of a three-phase current after the power tube of an inverter exhibits an open circuit failure. Therefore, the technique for an inverter cannot be directly adopted for a rectifier.

Conventional failure diagnosis techniques may be mainly classified into current signal-based failure diagnosis methods, voltage signal-based failure diagnosis methods, model-based failure diagnosis methods, and artificial intelligence-based failure diagnosis methods. Among these methods, current signal-based failure diagnosis methods are simpler, but such methods are prone to influences of load power and take a longer time for diagnosis. Voltage signal-based failure diagnosis method are able to come up with a diagnosis quickly, but usually requires an additional voltage transceiver or a hardware component to obtain a voltage signal sensitive to the state of the power tube. Model-based failure diagnosis method require an accurate mathematical model, and the computational load thereof is correspondingly greater. Artificial intelligence-based failure diagnosis method are based on analyses on sampled signals of voltages and currents throughout the history of the rectifier, and smart algorithms, such as neural networks and genetic algorithms, may be adopted. However, the computational load thereof is greater, making it difficult to realize such method in the control system of a rectifier.

Thus, how to quickly and accurately realize a diagnosis for an open circuit failure of a power tube without adding a hardware component remains an issue to work on.

SUMMARY OF THE INVENTION

In view of the conventional techniques, the embodiments of the invention provide a failure diagnosis method and apparatus for an open circuit failure of a power tube of a three-phase rectifier based on a current signal, which only require a current sampled signal readily existing in a control system of a rectifier and some other intermediate computing signals and do not require an additional hardware component. By analyzing these signals, a quick and accurate analysis on an open circuit failure of the power tube can be realized.

An aspect of the invention provides a failure diagnosis method for an open circuit failure of a power tube of a three-phase rectifier based on a current signal. The failure diagnosis method includes: (1) obtaining a relevant signal for diagnosis from a control system of a rectifier, wherein the signal includes a three-phase current sampled signal on an AC side of the rectifier, a voltage phase angle calculated by a phase-locking loop in the control system, and a direct-axis current and a quadrature-axis current obtained through Park conversion in the control system; (2) obtaining a reference value of a current signal through the direct-axis current and the quadrature-axis current, and performing a normalization process on the three-phase current sampled signal by using the reference value to obtain a normalized current signal of a corresponding phase; (3) determining whether a power tube of an X phase fails according to a time duration during which the normalized current signal of the X phase is in a zero-crossing diagnosis interval, wherein X=A, B, or C and represents a phase of presence; and (4) after a failure is determined as occurring in the X phase, determining a positive/negative half cycle in which a current is present when the failure occurs in the X phase based on the voltage phase angle calculated by the phase-locking loop in the control system, so as to specify a failed power tube.

According to an embodiment of the invention, a reference value $i_N[k]$ of the current signal is calculated according to $i_N[k]=\sqrt{i_d^2[k]+i_q^2[k]}$. $i_d[k]$ represents the direct-axis current, $i_q[k]$ represents the quadrature-axis current, and k represents time.

According to an embodiment of the invention, the normalization process is performed on a three-phase current sampled signal $i_X[k]$ by using a reference current $i_N[k]$ according to $i_{XN}[k]=i_X[k]/i_N[k]$ to obtain a normalized current $i_{XN}[k]$. X=A, B, or C and represents the phase of presence, and $i_X[k]$ represents the three-phase current sampled signal on the AC side of the rectifier.

According to an embodiment of the invention, the zero-crossing diagnosis interval is a range in which an absolute value of the normalized current $i_{XN}[k]$ is less than 0.1, and an absolute value of a derivative of the normalized current $i_{XN}[k]$ is less than 0.5 w. w=2πf represents an angular frequency of a three-phase current, and f represents a current frequency.

According to an embodiment of the invention, (3) includes: comparing a time duration $t_X$ during which the normalized current $i_{XN}[k]$ is in the zero-crossing diagnosis interval and a time threshold $T_{th}$. If $t_X > T_{th}$, it is determined that the power tube of the X phase exhibits an open circuit failure, and if not, the power tube of the X phase does not exhibit the open circuit failure.

According to an embodiment of the invention, (4) includes: determining the positive/negative half cycle in which the current $i_X[k]$ is present when the failure occurs in the X phase according to the voltage phase angle calculated by the phase-locking loop in the control system after determining that the failure occurs in the X phase. If the current $i_X[k]$ is in the negative half cycle when the failure occurs in the X phase, an upper bridge arm power tube of the X phase is determined as failed, and if the current $i_X[k]$ is in the positive half cycle when the failure occurs in the X phase, a lower bridge arm power tube of the X phase is determined as failed.

According to another aspect of the invention, a failure diagnosis apparatus for an open circuit failure of a power tube of a three-phase rectifier based on a current signal is provided. The failure diagnosis apparatus includes: a diagnosis signal obtaining module, configured to obtain a relevant signal for diagnosis from a control system of a rectifier, wherein the signal comprises a three-phase current sampled signal on an AC side of the rectifier, a voltage phase angle calculated by a phase-locking loop in the control system, and a direct-axis current and a quadrature-axis current obtained through Park conversion in the control system; a normalization process module, configured to obtain a reference value of a current signal through the direct-axis current and the quadrature-axis current, and perform a normalization process on the three-phase current sampled signal by using the reference value to obtain a normalized current signal of a corresponding phase; a failure diagnosis module, configured to determine whether a power tube of an X phase fails according to a time duration during which the normalized current signal of the X phase is in a zero-crossing diagnosis interval, wherein X=A, B, or C and represents a phase of presence; and a failure specifying module, after a failure is determined as occurring in the X phase, configured to determine a positive/negative half cycle in which a current is present when the failure occurs in the X phase based on the voltage phase angle calculated by the phase-locking loop in the control system, so as to specify a failed power tube.

According to an embodiment of the invention, a reference value $i_N[k]$ of the current signal is calculated according to $i_N[k]=\sqrt{i_d^2[k]+i_q^2[k]}$. $i_d[k]$ represents the direct-axis current, $i_q[k]$ represents the quadrature-axis current, and k represents time.

According to an embodiment of the invention, the normalization process is performed on a three-phase current sampled signal $i_X[k]$ by using a reference current $i_N[k]$ according to $i_{XN}[k]=i_X[k]/i_N[k]$ to obtain a normalized current $i_{XN}[k]$. X=A, B, or C and represents the phase of presence, and $i_X[k]$ represents the three-phase current sampled signal on the AC side of the rectifier.

According to an embodiment of the invention, the zero-crossing diagnosis interval is a range in which an absolute value of the normalized current $i_{XN}[k]$ is less than 0.1, and an absolute value of a derivative of the normalized current $i_{XN}[k]$ is less than 0.5 w. w=2πf represents an angular frequency of a three-phase current, and f represents a current frequency.

According to an embodiment of the invention, the failure determining module is configured to compare a time duration $t_X$ during which the normalized current $i_{XN}[k]$ is in the zero-crossing diagnosis interval and a time threshold $T_{th}$. If $t_X > T_{th}$, it is determined that the power tube of the X phase exhibits an open circuit failure, and if not, the power tube of the X phase does not exhibit the open circuit failure.

According to an embodiment of the invention, the failure specifying module is configured to determine the positive/negative half cycle in which the current $i_X[k]$ is present when the failure occurs in the X phase according to the voltage phase angle calculated by the phase-locking loop in the control system after the failure determining module determines that the failure occurs in the X phase. If the current $i_X[k]$ is in the negative half cycle when the failure occurs in the X phase, an upper bridge arm power tube of the X phase is determined as failed, and if the current $i_X[k]$ is in the positive half cycle when the failure occurs in the X phase, a lower bridge arm power tube of the X phase is determined as failed.

Yet another aspect of the invention provides a computer-readable storage medium, storing a computer program. The computer program realizes the failure diagnosis method when being executed by a processor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
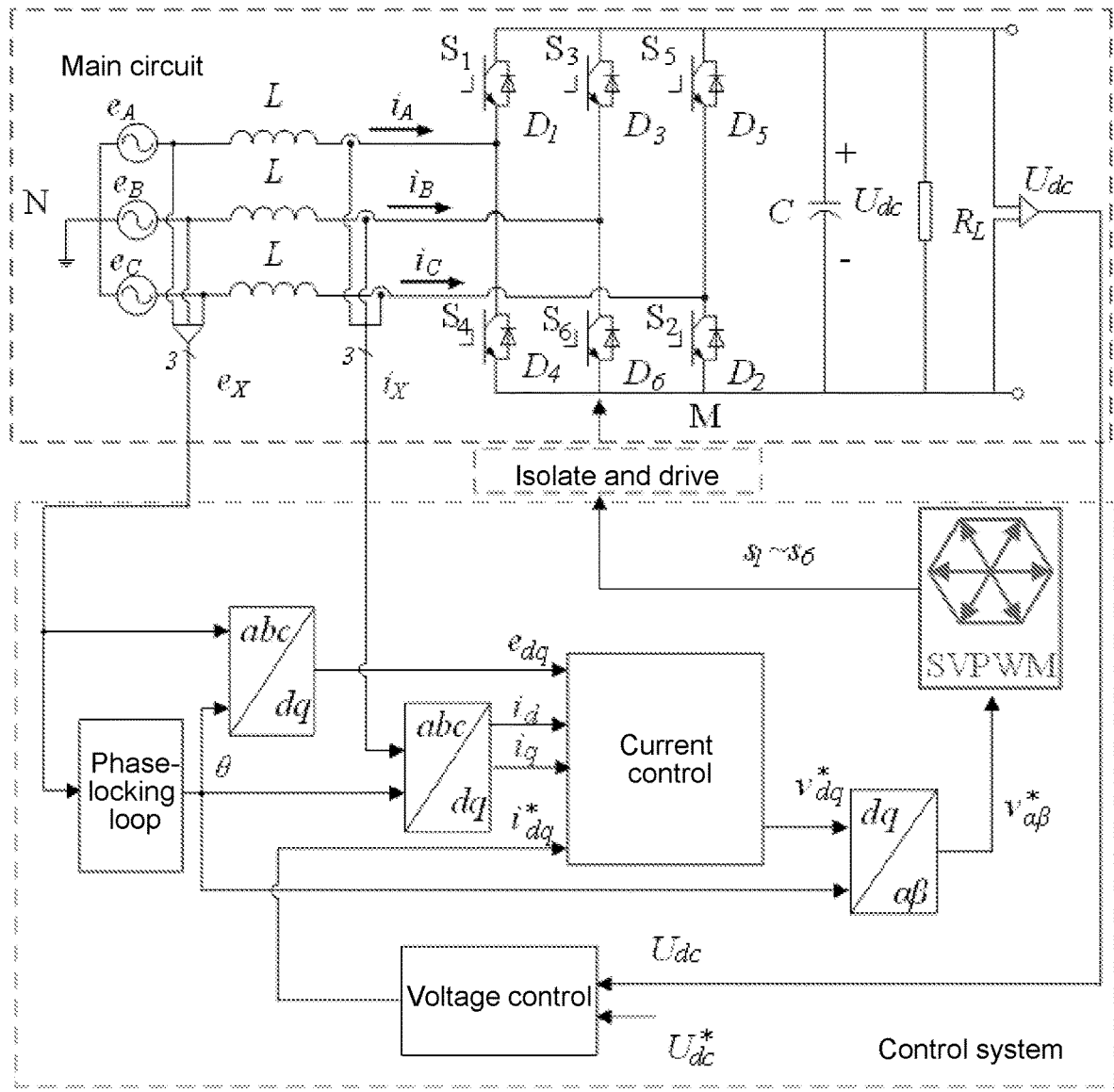
FIG. 1 is a schematic diagram illustrating a main circuit and a control system of a three-phase two level rectifier system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

To more clearly and comprehensively describe the objectives, technical solutions, and advantages of the invention, the invention will be described in detail in the following with reference to the accompanying drawings and embodiments. It should be understood that the embodiments specifically described herein merely serve to describe the invention and shall not be construed as limitations on the invention. In addition, the technical features involved in the respective embodiments of the invention may be combined with one another as long as such technical features do not conflict each other.

First Embodiment

As shown in FIG. 1, the core components for realizing current conversion in a typical three-phase two-level voltage type pulse width modulation rectifier include six power tubes $S_1$ to $S_6$ and six diodes $D_1$ to $D_6$ disposed correspondingly. Among the power tubes, A-phase power tubes are $S_1$ and $S_4$, B-phase power tubes are $S_3$ and $S_6$, and C-phase power tubes are $S_5$ and $S_2$. $S_1$, $S_3$, and $S_5$ are referred to as upper bridge arm power tubes, whereas $S_4$, $S_6$, and $S_2$ are referred to as lower bridge arm power tubes. The power tubes, a filter inductor L, and a filter capacitor C jointly form a main circuit part of the rectifier. A control system of the rectifier obtains an AC voltage $e_X$, an AC current $i_X$, and a DC voltage value $U_{dc}$ of the main circuit through a current transceiver, a voltage transceiver, and a modulus conversion module, and calculates and output driving signals $s_1$-$s_6$ to control the operations of the respective power tubes.

There are some important process amounts in the control system, including a phase angle $\theta$ calculated by a phase-locking loop in the control system, a direct-axis current $i_d[k]$ and a quadrature-axis current $i_q[k]$ obtained through a Park conversion (abc→dq) in the control system.

The phase angle $\theta$ is calculated by the phase-locking loop in the control system. With the direct-axis current $i_d[k]$ and the quadrature-axis current $i_q[k]$, a current $i_X[k]$ is converted from a three-phase stationary coordinate system into a two-phase rotating coordinate system, which may be calculated according to the formula (Park conversion) in the following:

$$\begin{bmatrix} i_d[k] \\ i_q[k] \end{bmatrix} = \begin{bmatrix} \cos\theta & \cos\left(\frac{\theta-2\pi}{3}\right) & \cos\left(\frac{\theta+2\pi}{3}\right) \\ -\sin\theta & -\sin\left(\frac{\theta-2\pi}{3}\right) & -\sin\left(\frac{\theta+2\pi}{3}\right) \end{bmatrix} \begin{bmatrix} i_A[k] \\ i_B[k] \\ i_C[k] \end{bmatrix}$$

The diagnosis method according to the embodiment of the invention only requires a current sampled value $i_X[k]$, and the phase angle $\theta$, the direct-axis current $i_d[k]$ and the quadrature-axis current $i_q[k]$ as the process amounts to realize the diagnosis for a power tube in which an open circuit occurs, and does not require an additional hardware component.

Figure 2:
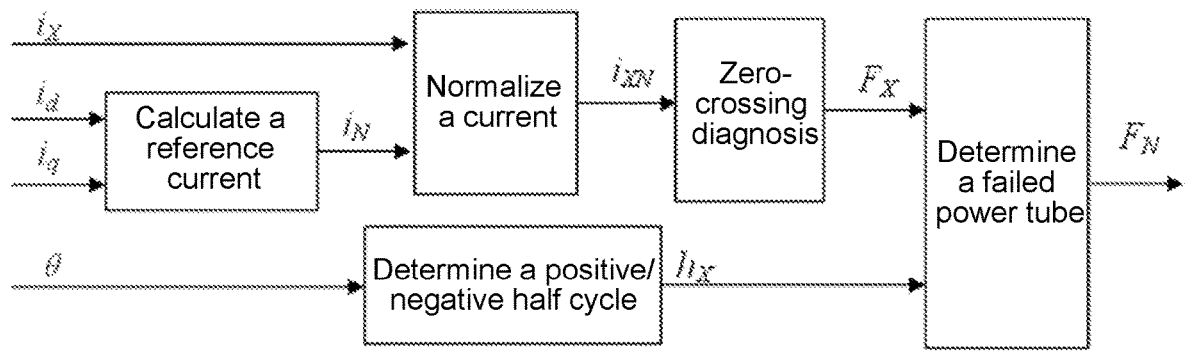
FIG. 2 is a schematic flowchart illustrating a failure diagnosis method for an open circuit failure of a power tube according to an embodiment of the invention.

FIG. 2 is a schematic flowchart illustrating a method according to an embodiment of the invention. The method includes steps as follows.

S1: A relevant signal for diagnosis is obtained from a control system of a rectifier. The relevant signal includes a three-phase current sampled signal $i_X[k]$ on an AC side of the rectifier, wherein the subscripted symbol X (=A, B, or C) thereof represents a phase of presence, and k represents time; the voltage phase angle $\theta$ calculated by a phase-locking loop in the control system, and the direct-axis current $i_d[k]$ and the quadrature-axis current $i_q[k]$ obtained through Park conversion in the control system.

S2: A reference value $i_N[k]$ of a current signal is obtained through the direct-axis current $i_d[k]$ and the quadrature-axis current $i_q[k]$, and a normalization process is performed on the three-phase current sampled signal $i_X[k]$ by using the reference value $i_N[k]$ to obtain a normalized current signal $i_{XN}[k]$ of a corresponding phase.

In the embodiment of the invention, in order to reduce the influence of a load power on the amplitude of the three-phase current $i_X[k]$, the three-phase current $i_X[k]$ needs to be normalized. Firstly, the reference value $i_N[k]$ of the current signal is calculated through the direct-axis current $i_d[k]$ and the quadrature-axis current $i_q[k]$.

$$i_N[k] = \sqrt{i_d^2[k] + i_q^2[k]}$$

By performing the normalization process on the three-phase current sampled signal $i_X[k]$ by using the reference current $i_N[k]$, the normalized current $i_{XN}[k]$ is obtained.

$$i_{XN}[k] = i_X[k]/i_N[k]$$

After the three-phase current $i_X[k]$ is normalized, even if the load is changed, the normalized current $i_{XN}[k]$ may still exhibit a sine waveform with an amplitude about 1.

S3: Whether a power tube of an X phase fails is determined according to a time duration during which the normalized current signal of the X phase is in a zero-crossing diagnosis interval, wherein X=A, B, or C and represents a phase of presence.

Figure 3:
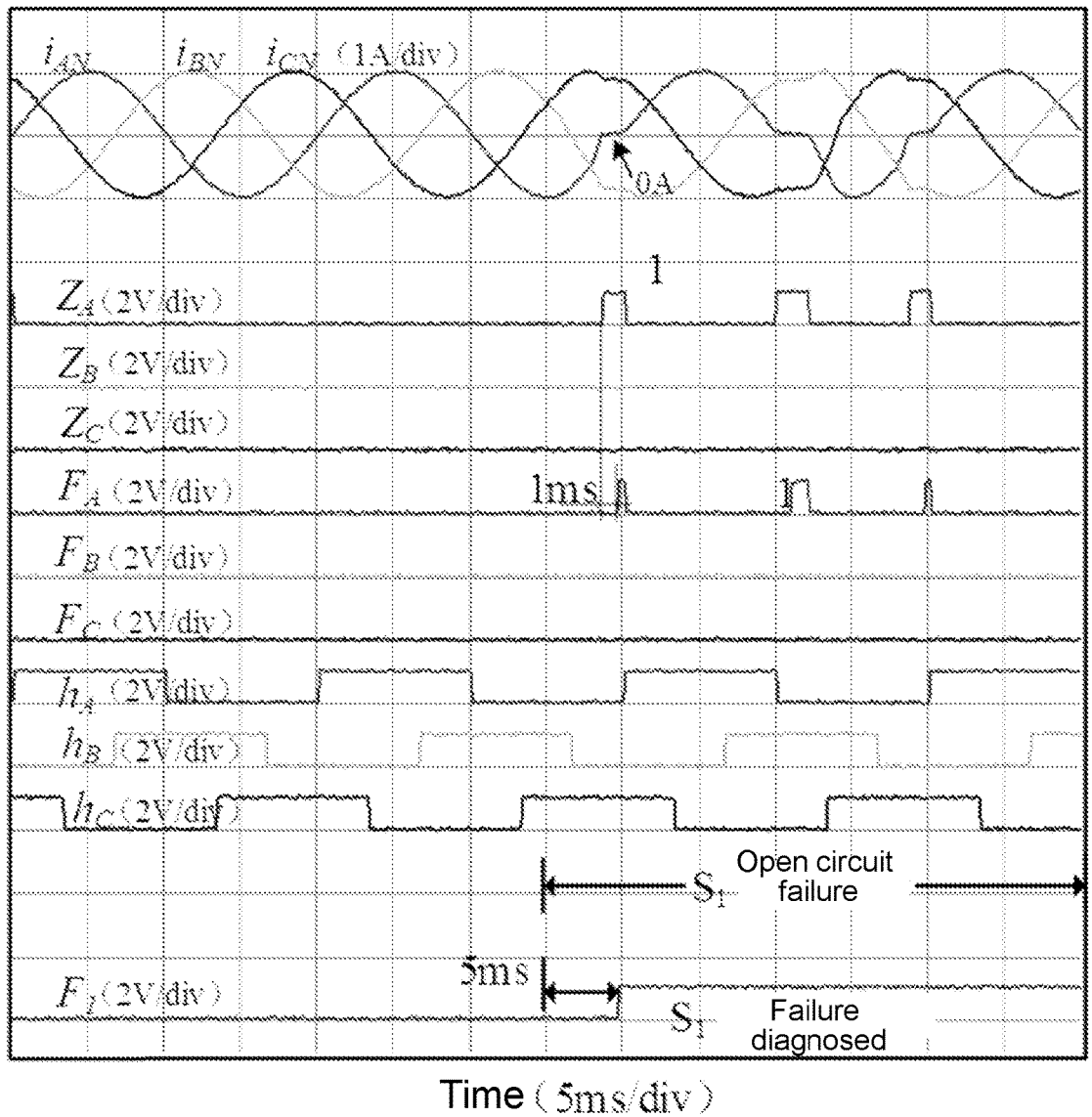
FIG. 3 is a schematic diagram illustrating experimental results when a method according to an embodiment of the invention is adopted after an open circuit failure of a power tube occurs.

In the embodiment of the invention, as shown in FIG. 3, when the power tubes operate normally, the normalized current $i_{XN}[k]$ exhibits a sine waveform. However, when an open circuit failure occurs in the power tube, the three-phase current may be distorted and no longer exhibit a standard sine waveform. Specifically, the key change for diagnosing a failure is that the current $i_{XN}[k]$ of the phase where the power tube exhibiting the open circuit failure is present is maintained around 0 for a certain time. Therefore, regarding the X phase (X=A, B, or C) of the rectifier, the characteristic of the current of the X phase when the current crosses zero is adopted as a diagnostic variable.

Regarding the X phase, the absolute value of the normalized current $i_{XN}[k]$ of the phase is less than 0.1, and the range in which the absolute value of the derivative of the normalized current $i_{XN}[k]$ is less than 0.5 w is referred to as a zero-crossing diagnosis region.

Here, $w=2\pi f$ represents the angular frequency of the three-phase current, and f represents the current frequency. In the embodiment of the invention, $w=100\pi$, and the corresponding grid frequency is 50 Hz.

When the power tubes operate normally, the normalized current $i_{XN}[k]$ exhibits a sine waveform whose amplitude is about 1. Therefore, the range in which the absolute value of the current is less than 0.1 is quite narrow. At this time, the derivative of the normalized current $i_{XN}[k]$ is usually greater than 0.5 w. Therefore, under a normal situation, the time duration $t_X$ during which the normalized current $i_{XN}[k]$ is in the zero-crossing diagnosis region is usually 0. When the power tube exhibits the open circuit failure, the current $i_{XN}[k]$ in the phase in which the failure occurs may be maintained around 0 for a certain time. At this time, the derivative of the normalized current $i_{XN}[k]$ is less than 0.5 w, and the time duration $t_X$ during which the normalized current $i_{XN}[k]$ is in the zero-crossing diagnosis region is no longer 0.

Therefore, the time duration $t_X$ may serve as the diagnostic variable when the power tube of a phase has a failure. In the embodiment, when the absolute value of the normalized current $i_{XN}[k]$ of the X phase is less than 0.1 and the derivative thereof is less than 0.5 w, a zero-crossing signal $Z_X$ is output. As shown in FIG. 3, when the power tubes are normal, the zero-crossing signals $Z_X$ of the three phases are all 0. When a failure occurs in $S_1$, a zero-crossing signal $Z_A$ of the A phase becomes 1, whereas a zero-crossing signal $Z_B$ of the B phase and a zero-crossing signal $Z_C$ of the C phase remain to be 0.

To avoid an erroneous diagnosis due to factors such as current sampling error, noise, etc., when the zero-crossing signal $Z_X$ becomes 1, a determination cannot be directly made that the power tube of the X phase fails. In the embodiment of the invention, a time threshold $T_{th}$ is set. When the zero-crossing signal $Z_X$ continues over the time threshold $T_{th}$, the power tube of the phase is determined as failed, and a failure phase signal $F_X$ is output. In the embodiment of the invention, the time threshold $T_{th}$ is set through simulated experimentation. Considering the accuracy and the speediness of the diagnosis result, the time threshold $T_{th}$ may be set at 1 ms. While experimental results suggest such value as reasonable, the invention is not limited thereto. As shown in FIG. 3, when $Z_A$ continues over 1 ms, a failure phase signal $F_A$ of the A phase becomes 1.

S4: After a failure is determined as occurring in the X phase, a positive/negative half cycle in which a current is present when the the failure occurs in the X phase is determined based on the voltage phase angle calculated by the phase-locking loop in the control system, so as to specify a failed power tube.

By analyzing the current direction and the operation state of the power tube, it is known that the power tube is not constantly operating throughout a cycle. Taking $S_1$ as an example, when the direction of a current $i_A[k]$ of the A phase is positive (assuming the current direction shown in FIG. 1 is the positive direction), the current $i_A[k]$ of the A phase flows through the corresponding diode $D_1$, instead of $S_1$. Meanwhile, when the direction of the current $i_A[k]$ of the A phase is negative, the current $i_A[k]$ of the A phase flows through $S_1$. Since S1 merely operates during the negative half cycle of the current $i_A[k]$ of the A phase, when $S_1$ exhibits an open circuit failure, only the negative half cycle of the current $i_A[k]$ of the A phase is affected, while the positive half cycle of the current $i_A[k]$ of the A phase is not affected. Correspondingly, once the lower bridge arm power tube $S_4$ of the A phase exhibits an open circuit failure, only the positive half cycle of the current $i_A[k]$ of the A phase is affected. Therefore, the power tube in which the open circuit failure occurs can be specified according to the half cycle in which the passing current is present when being distorted. If the current distortion occurs in the negative half cycle, the upper bridge arm power tube is determined as failed. Alternatively, if the current distortion occurs in the positive half cycle, the lower bridge arm power tube is determined as failed. Such a determination process is applicable for all the A, B, and C phases.

The positive/negative half cycle in which the current $i_X[k]$ in the phase where the failure occurs on the AC side is present may be determined according to the voltage θ and a power factor Q (normally 1) set when the rectifier operates.

When the apparatus operates at a unit power factor, the positive/negative half cycle in which the current is present may be determined according to the voltage phase angle. The relationship between the phase current half cycles corresponding to the respective power tubes and the voltage phase angles is as shown in Table 1:

TABLE 1

| Power tube | Phase of presence | Working half cycle | Phase angle (°) |
|---|---|---|---|
| $S_1$ | A | Negative | 180-360 |
| $S_4$ | A | Positive | 0-180 |
| $S_3$ | B | Negative | 300-360, 0-120 |
| $S_6$ | B | Positive | 120-300 |
| $S_5$ | C | Negative | 60-240 |
| $S_2$ | C | Positive | 240-360, 0-60 |

After determining the positive/negative half cycle of the current, a phase half cycle signal $h_X$ is output. When the current of the phase is in the positive half cycle, $h_X=1$, and when the current of the phase in the positive half cycle $h_X=0$.

Therefore, the failed power tube may be specified according to the failure phase signal $F_X$ and the phase half cycle signal $h_X$. After the failed power tube is specified, a power tube failure signal $F_n$, n=1, 2, 3, 4, 5, 6, is changed to and maintained at 1 from 0 The relationship between the failed power tube and the signal is as shown in Table 2.

TABLE 2

| Power tube | $F_n$ | $F_X$ | $h_X$ |
|---|---|---|---|
| $S_1$ | 1 | $F_A = 1$ | $h_A = 0$ |
| $S_4$ | 4 | $F_A = 1$ | $h_A = 1$ |
| $S_3$ | 3 | $F_B = 1$ | $h_B = 0$ |
| $S_6$ | 6 | $F_B = 1$ | $h_B = 1$ |
| $S_5$ | 5 | $F_C = 1$ | $h_C = 0$ |
| $S_2$ | 2 | $F_C = 1$ | $h_C = 1$ |

As shown in FIG. 3, when $F_A$ is changed from 0 to 1, the power tube of the A phase exhibits an open circuit failure. At this time, $h_A=0$, indicating that the failure occurs in the negative half cycle of the current of the A phase. Therefore, according to Table 2, the failed power tube is $S_1$, and the power tube failure signal $F_1$ is changed to and maintained at 1 from 0.

In addition, as shown in FIG. 3, the failure of $S_1$ is diagnosed 5 ms after the open circuit failure occurs in $S_1$. This suggests the accuracy and speediness of the failure diagnosis method according to the invention.

Based on the above steps, by using the method according to the invention, the failed power tube can generally be diagnosed within a half of a elementary cycle (10 ms, when the frequency is 50 Hz) after a power tube exhibits an open circuit failure.

Second Embodiment

Figure 4:
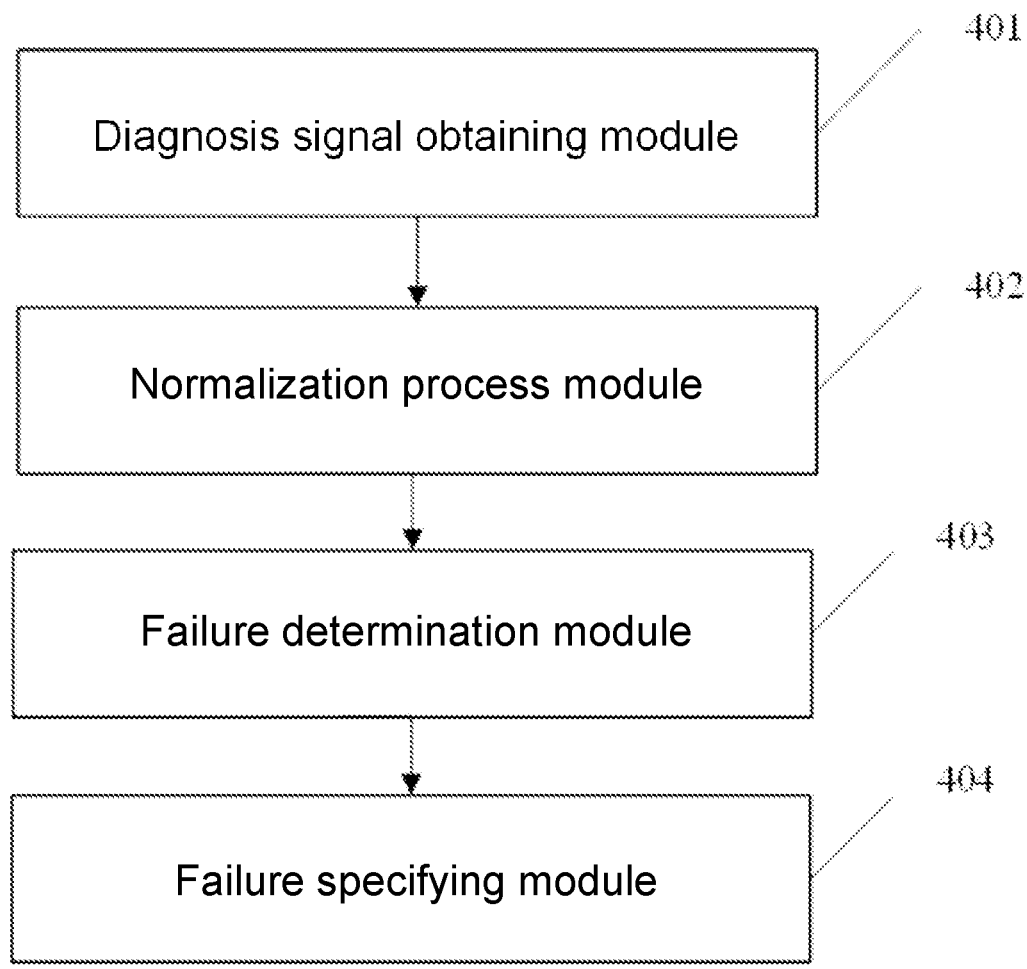
FIG. 4 is a schematic diagram illustrating a structure of an apparatus according to an embodiment of the invention.

FIG. 4 is a schematic diagram illustrating a structure of an apparatus according to an embodiment of the invention. The apparatus includes: a diagnosis signal obtaining module 401, configured to obtain a relevant signal for diagnosis from a control system of a rectifier, wherein the signal includes a three-phase current sampled signal on an AC side of the rectifier, a voltage phase angle calculated by a phase-locking loop in the control system, and a direct-axis current and a quadrature-axis current obtained through Park conversion in the control system; a normalization process module 402, configured to obtain a reference value of a current signal through the direct-axis current and the quadrature-axis current, and perform a normalization process on the three-phase current sampled signal by using the reference value to obtain a normalized current signal of a corresponding phase; a failure determination module 403, configured to determine whether a power tube of an X phase fails according to a time duration during which the normalized current signal of the X phase is in a zero-crossing diagnosis interval, wherein X=A, B, or C and represents a phase of presence; and a failure specifying module 404, after a failure is determined as occurring in the X phase, configured to determine a positive/negative half cycle in which a current is present when the the failure occurs in the X phase based on the voltage phase angle calculated by the phase-locking loop in the control system, so as to specify a failed power tube.

More specifically, the reference value $i_N[k]$ of the current signal is calculated according to $i_N[k]=\sqrt{i_d^2[k]+i_q^2[k]}$. $i_d[k]$ represents the direct-axis current, iq[k] represents the quadrature-axis current, and k represents time.

More specifically, the normalization process is performed on the three-phase current sampled signal $i_X[k]$ by using the reference current $i_N[k]$ according to $i_{XN}[k]=i_X[k]/i_N[k]$ to obtain the normalized current $i_{XN}[k]$. X=A, B, or C and represents the phase of presence, and $i_X[k]$ represents the three-phase current sampled signal on the AC side of the rectifier.

More specifically, the zero-crossing diagnosis interval is a range in which the absolute value of the normalized current $i_{XN}[k]$ is less than 0.1, and the absolute value of the derivative of the normalized current $i_{XN}[k]$ is less than 0.5 w. In addition, $w=2\pi f$ represents the angular frequency of the three-phase current, and f represents the current frequency.

More specifically, the failure determination module 403 is configured to compare the the time duration $t_X$ during which the normalized current $i_{XN}[k]$ is in the zero-crossing diagnosis interval and the time threshold $T_{th}$. If $t_X > T_{th}$, it is determined that the power tube of the X phase exhibits an open circuit failure. If not, the power tube of the X phase does not exhibit the open circuit failure.

More specifically, the failure specifying module 404 is configured to determine the positive/negative half cycle in which the current $i_X[k]$ is present when the failure occurs in the X phase according to the voltage phase angle calculated by the phase-locking loop in the control system after the failure determining module 403 determines that the failure occurs in the X phase. If the current $i_X[k]$ is in the negative half cycle when the failure occurs in the X phase, the upper bridge arm power tube of the X phase is determined as failed. If the current $i_X[k]$ is in the positive half cycle when the failure occurs in the X phase, the lower bridge arm power tube of the X phase is determined as failed.

Details about the specific embodiments of the respective modules have been described above for the embodiment of the failure diagnosis method. Thus, the same details will not be repeated in the following.

Third Embodiment

The invention further provides a computer-readable storage medium, such as a flash drive, a hard drive, a multimedia card, a card-type memory (e.g., an SD or DX memory, etc.), a random access memory (RAM), a static random access memory (SRAM), a read-only memory (ROM), an electrically erasable programmable read-only memory (EEPROM), a programmable read-only memory (PROM), a magnetic memory, a magnetic drive, an optical drive, a server, an APP market, in which a computer program is stored. When being executed by a processor, the program realizes a failure diagnosis method for an open circuit failure of a power tube of a three-phase rectifier based on a current signal according to the failure diagnosis method described in the embodiment.

Based on the above, compared with the conventional art, the failure diagnosis method of the invention only requires a sampled current readily existing in the control system of the rectifier and some intermediate computing signals and is therefore simple and requires little computing resource. The distortion of a current after the open circuit failure occurs in the power tube of the rectifier and a positive/negative half cycle in which the current is present when the failure occurs are adopted as diagnostic variables. By analyzing the sampled current, a quick diagnosis on the power tube having the open circuit failure is provided. Thus, the invention is highly applicable. Thus, a quick and accurate diagnosis on an open circuit failure of the power tube of the three-phase rectifier can be provided without adding a hardware component.

It should be noted that, based on the needs for implementation, each step/member described in the embodiments of the invention may be divided into further steps/members, or two or more steps/members or portions of steps/members may be combined to form a new step/member to realize the objective of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A failure diagnosis method for an open circuit failure of a power tube of a three-phase rectifier based on a current signal, the failure diagnosis method comprising:
   (1) obtaining a relevant signal for diagnosis from a control system of a rectifier, wherein the relevant signal comprises a three-phase current sampled signal on an AC side of the rectifier, a voltage phase angle calculated by a phase-locking loop in the control system, and a direct-axis current and a quadrature-axis current obtained through Park conversion in the control system;
   (2) obtaining a reference value of a current signal through the direct-axis current and the quadrature-axis current, and performing a normalization process on the three-phase current sampled signal by using the reference value to obtain a normalized current signal of a corresponding phase;
   (3) determining whether a power tube of an X phase fails according to a time duration during which the normalized current signal of the X phase is in a zero-crossing diagnosis interval, wherein X=A, B, or C and represents a phase of presence; and
   (4) after a failure is determined as occurring in the X phase, determining a positive/negative half cycle in which a current is present when the failure occurs in the X phase based on the voltage phase angle calculated by the phase-locking loop in the control system, so as to specify a failed power tube.

2. The failure diagnosis method as claimed in claim 1, wherein a reference value $i_N[k]$ of the current signal is calculated according to $i_N[k]=\sqrt{i_d^2[k]+i_q^2[k]}$, wherein $i_d[k]$ represents the direct-axis current $i_d[k]$ represents the quadrature-axis current, and k represents time.

3. The failure diagnosis method as claimed in claim 2, wherein the normalization process is performed on a three-phase current sampled signal $i_X[k]$ by using a reference current $i_N[k]$ according to $i_{XN}[k]=i_X[k]/i_N[k]$ to obtain a normalized current $i_{XN}[k]$, wherein X=A, B, or C and represents the phase of presence, and $i_X[k]$ represents the three-phase current sampled signal on the AC side of the rectifier.

4. The failure diagnosis method as claimed in claim 3, wherein the zero-crossing diagnosis interval is a range in which an absolute value of the normalized current $i_{XN}[k]$ is less than 0.1, and an absolute value of a derivative of the normalized current $i_{XN}[k]$ is less than 0.5 w, wherein $w=2\pi f$ represents an angular frequency of a three-phase current, and f represents a current frequency.

5. The failure diagnosis method as claimed in claim 4, wherein (3) comprises:

comparing a time duration $t_X$ during which the normalized current $i_{XN}[k]$ is in the zero-crossing diagnosis interval and a time threshold $T_{th}$, wherein if $t_X>T_{th}$, it is determined that the power tube of the X phase exhibits an open circuit failure, and if not, the power tube of the X phase does not exhibit the open circuit failure.

6. The failure diagnosis method as claimed in claim 5, wherein (4) comprises:

determining the positive/negative half cycle in which the current $i_X[k]$ is present when the failure occurs in the X phase according to the voltage phase angle calculated by the phase-locking loop in the control system after it is determined that the failure occurs in the X phase, wherein if the current $i_X[k]$ is in the negative half cycle when the failure occurs in the X phase, an upper bridge arm power tube of the X phase is determined as failed, and if the current $i_X[k]$ is in the positive half cycle when the failure occurs in the X phase, a lower bridge arm power tube of the X phase is determined as failed.

7. A computer-readable non-transitory storage medium, storing a computer program, wherein the computer program realizes the failure diagnosis method according to claim 1 when being executed by a processor.

8. A failure diagnosis apparatus for an open circuit failure of a power tube of a three-phase rectifier based on a current signal, the failure diagnosis apparatus comprising:

a diagnosis signal obtaining module, configured to obtain a relevant signal for diagnosis from a control system of a rectifier, wherein the relevant signal comprises a three-phase current sampled signal on an alternating current (AC) side of the rectifier, a voltage phase angle calculated by a phase-locking loop in the control system, and a direct-axis current and a quadrature-axis current obtained through Park conversion in the control system;

a normalization process module, configured to obtain a reference value of a current signal through the direct-axis current and the quadrature-axis current, and perform a normalization process on the three-phase current sampled signal by using the reference value to obtain a normalized current signal of a corresponding phase;

a failure diagnosis module, configured to determine whether a power tube of an X phase fails according to a time duration during which the normalized current signal of the X phase is in a zero-crossing diagnosis interval, wherein X=A, B, or C and represents a phase of presence; and a failure specifying module, after a failure is determined as occurring in the X phase, configured to determine a positive/negative half cycle in which a current is present when the failure occurs in the X phase based on the voltage phase angle calculated by the phase-locking loop in the control system, so as to specify a failed power tube.

9. The failure diagnosis apparatus as claimed in claim 8, wherein the failure determining module is configured to compare the a time duration during which the normalized current is in the zero-crossing diagnosis interval and a time threshold, wherein if the time duration during which the normalized current is in the zero-crossing diagnosis interval is greater than the time threshold, the failure determining module determines that the power tube of the X phase exhibits an open circuit failure, and if the time duration during which the normalized current is in the zero-crossing diagnosis interval is not greater than the time threshold, the power tube of the X phase does not exhibit the open circuit failure.

10. The failure diagnosis apparatus as claimed in claim 9, wherein the failure specifying module is configured to determine the positive/negative half cycle in which the current is present when the failure occurs in the X phase according to the voltage phase angle calculated by the phase-locking loop in the control system after the failure determining module determines that the failure occurs in the X phase, wherein if the current is in the negative half cycle when the failure occurs in the X phase, an upper bridge arm power tube of the X phase is determined as failed, and if the current is in the positive half cycle when the failure occurs in the X phase, a lower bridge arm power tube of the X phase is determined as failed.

11. The failure diagnosis apparatus as claimed in claim 8, wherein the failure specifying module is configured to determine the positive/negative half cycle in which the current is present when the failure occurs in the X phase according to the voltage phase angle calculated by the phase-locking loop in the control system after the failure determining module determines that the failure occurs in the X phase, wherein if the current is in the negative half cycle when the failure occurs in the X phase, an upper bridge arm power tube of the X phase is determined as failed, and if the current is in the positive half cycle when the failure occurs in the X phase, a lower bridge arm power tube of the X phase is determined as failed.

* * * * *